United States Patent
Pao

(10) Patent No.: US 9,990,999 B2
(45) Date of Patent: *Jun. 5, 2018

(54) DATA STORAGE DEVICE AND VOLTAGE PROTECTION METHOD THEREOF

(71) Applicant: Silicon Motion, Inc., Jhubei (TW)

(72) Inventor: Yi-Hua Pao, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/809,539

(22) Filed: Nov. 10, 2017

(65) Prior Publication Data

US 2018/0096728 A1    Apr. 5, 2018

Related U.S. Application Data

(63) Continuation of application No. 14/444,429, filed on Jul. 28, 2014, now Pat. No. 9,847,134.

(60) Provisional application No. 61/864,409, filed on Aug. 9, 2013.

(30) Foreign Application Priority Data

Dec. 27, 2013  (TW) .............................. 102148612 A

(51) Int. Cl.
*G11C 16/06*    (2006.01)
*G11C 16/22*    (2006.01)

(52) U.S. Cl.
CPC .................................. *G11C 16/225* (2013.01)

(58) Field of Classification Search
CPC ............................. G11C 16/10; G11C 16/225
USPC ..................................................... 365/185.18
See application file for complete search history.

(56) References Cited

U.S. PATENT DOCUMENTS

2005/0122791 A1*  6/2005  Hajeck ............... G06K 19/0701
                                                       365/189.11
2010/0202238 A1*  8/2010  Moshayedi ......... G06F 11/1658
                                                       365/228

* cited by examiner

*Primary Examiner* — Tha-O H Bui
(74) *Attorney, Agent, or Firm* — Wang Law Firm, Inc.

(57) ABSTRACT

A data storage device includes a flash memory, a voltage detection device, and a controller. The flash memory is arranged to store data. The voltage detection device is arranged to detect a supply voltage received by the data storage device. The controller is configured to receive write commands from a host, and perform a prohibition mode when the supply voltage is outside a predetermined range, wherein the write command is arranged to enable the controller to write the flash memory, and the controller is further configured to disable all of the write commands received from the host in the prohibition mode.

12 Claims, 2 Drawing Sheets

US 9,990,999 B2

DATA STORAGE DEVICE AND VOLTAGE PROTECTION METHOD THEREOF

CROSS REFERENCE TO RELATED APPLICATIONS

This Application claims priority to Taiwan Patent Application No. 102148612, filed on Dec. 27, 2013, the entirety of which is incorporated by reference herein. Furthermore, this application is a continuation of U.S. Ser. No. 14/444,429, filed on Jul. 28, 2014, now U.S. Pat. No. 9,847,134, issued on Dec. 19, 2017, which is a non-provisional of U.S. Provisional Application No. 61/864,409 filed on Aug. 9, 2013.

BACKGROUND OF THE INVENTION

Field of the Invention

The present invention relates to a voltage protection method applied to a memory device, and in particular to a voltage protection method in response to the level of supply voltage.

Description of the Related Art

Flash memory is considered a non-volatile data storage device, using electrical methods to erase and program itself. Taking NAND Flash as an example, it is often used in memory cards, USB flash devices, solid state devices, eMMC and other uses.

Flash memory such as NAND Flash uses a multiple-block structure to store data, wherein the flash memory is constructed by floating gate transistors. The floating gates of the floating gate transistor may catch electronic charges for storing data. However, the floating gates may lose the electronic charges due to their operations and the various environmental parameters of the flash memory, which can lead to read and write errors.

BRIEF SUMMARY OF THE INVENTION

A detailed description is given in the following embodiments with reference to the accompanying drawings.

The present invention provides a data storage device. The data storage device includes a flash memory, a voltage detection device, and a controller. The flash memory is arranged to store data. The voltage detection device is arranged to detect a supply voltage received by the data storage device. The controller is configured to receive write commands from a host, and perform a prohibition mode when the supply voltage is outside a predetermined range, wherein the write command is arranged to enable the controller to write the flash memory, and the controller is further configured to disable all of the write commands received from the host while in the prohibition mode.

The present invention further provides a voltage protection method applied to a data storage device of a flash memory. The voltage protection method includes: determining whether a supply voltage received by the data storage device is outside a predetermined range; and enabling a prohibition mode when the supply voltage is outside a predetermined range for disabling write commands received from a host to write data into the flash memory.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
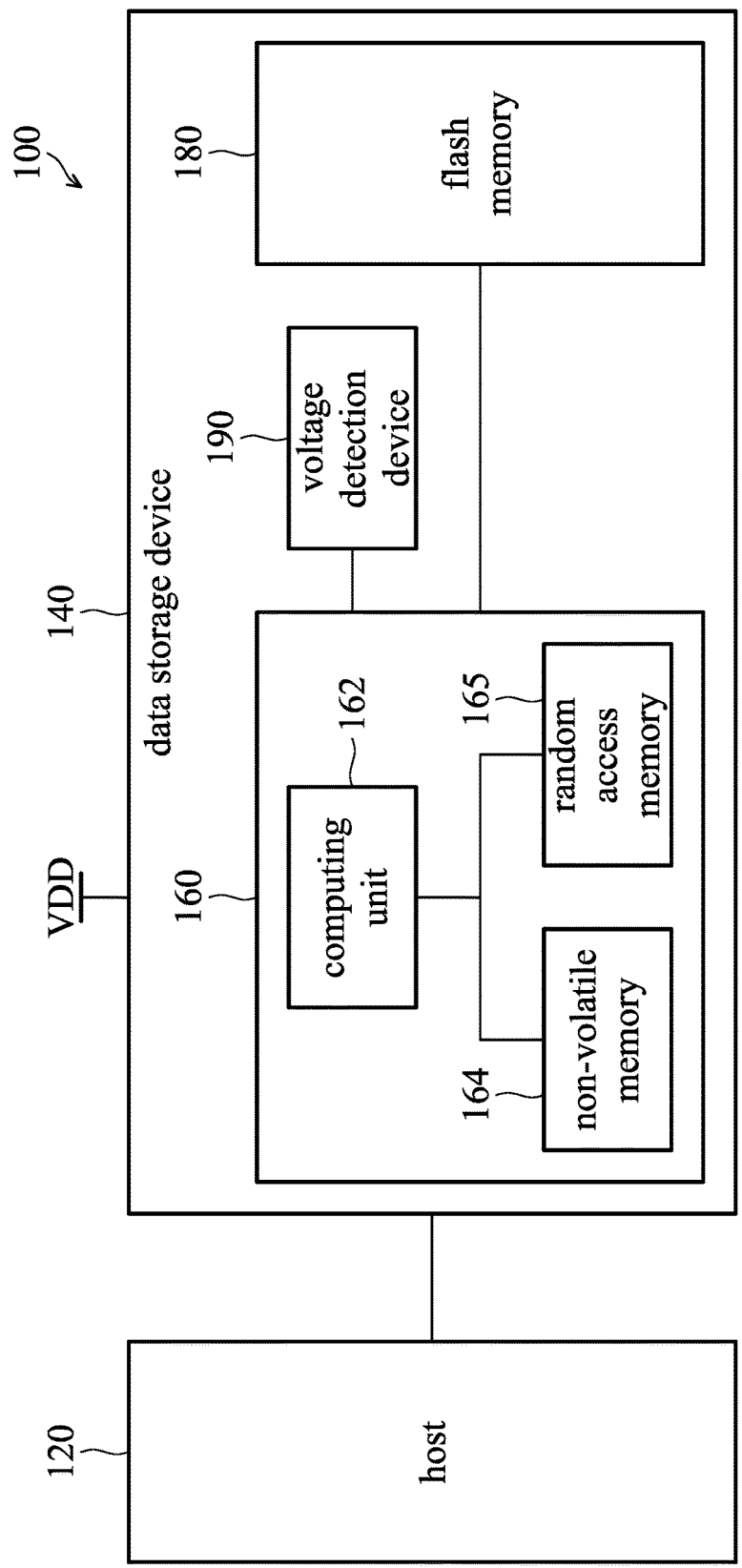
FIG. 1 is a schematic diagram illustrating an embodiment of an electronic system of the present invention.

FIG. 1 is a schematic diagram illustrating an embodiment of an electronic system of the present invention. The electronic system 100 includes a host device 120 and a data storage device 140. The data storage device 140 includes a controller 160, a flash memory 180 and a voltage detection device 190. Furthermore, the data storage device 140 is arranged to perform operations in response to the commands of the host device 120. The controller 160 further includes a computing unit 162, a non-volatile memory 164 (such as read only memory ROM) and a random access memory 165. The program code and data stored in the nonvolatile memory 164 may constitute firmware, and be performed by the computing unit 162, such that the controller 160 may control the flash memory 180 by the firmware. For example, the controller 160 may access the flash memory 180 according to the commands received from the host device 120 and automatically perform the access prohibition method of the present invention. The flash memory 180 has a plurality of blocks, and each of the blocks has a plurality of pages. It should be noted that, in other embodiments, the controller 160 may further include a timing device (not shown), but it is not limited thereto. For example, the controller 160 is configured to count time according to a clock signal received from other devices or a clock signal produced by the controller 160 itself. The voltage detection device 190 is arranged to detect the supply voltage VDD, and produce the voltage parameter in response to the variation of the supply voltage VDD. It should be noted that, in this embodiment, the voltage detection device 190 is arranged to detect the supply voltage VDD arranged to be provided to the flash memory 180. Namely, the power of the flash memory 180 is supplied by the supply voltage VDD, and the flash memory 180 is arranged to access data by the supply voltage VDD, but it is not limited thereto. In other embodiment, the voltage detection device 190 is further arranged to detect the supply voltage VDD applied to the controller 160. Namely, the power of the controller 160 is provided by the supply voltage VDD, and the controller 160 is configured to enable the flash memory 180 by the supply voltage VDD for accessing data. In another embodiment, the voltage detection device 190 is further arranged to detect the supply voltage VDD arranged to be applied to the flash memory 180 and the supply voltage VDD arranged to be applied to the controller 160, wherein the supply voltages VDD of the flash memory 180 and the controller 160 may be provided by different power sources, and have different predetermined ranges, respectively.

Moreover, the flash memory 180 is further arranged to store the parameters corresponding to at least one predetermined range of voltage level, wherein the predetermined range of voltage level is the range within which the flash memory 180 can successfully access data by the supply voltage, but it is not limited thereto. In another embodiment, the predetermined range of the voltage level is the range within which the controller 160 can successfully enable the flash memory 180 to read and write data. In other embodiments, the flash memory 180 further includes parameters corresponding to a plurality of predetermined ranges, wherein the controller 160 may be further configured to select one of the predetermined ranges according to a key or an identifier, and use the selected predetermined range as the predetermined range of the voltage protection method of the present invention. Person with skill in the art may determine the predetermined ranges according to the read and write error rates of the flash memory in different supply voltages VDD. It should be noted that, in one embodiment, different vendors and clients may have different keys and identifiers.

In one embodiment, the controller 160 is configured to enable a prohibition mode according to the supply voltage VDD to disable the host 120 to read data from or write data to the flash memory 180. For example, the controller 160 is further configured to receive read commands or write commands from the host 120, and operate in a prohibition mode when the supply voltage VDD is outside a predetermined range, wherein the read command is arranged to enable the controller 160 to retrieve data form the flash memory 180, and the write command is arranged to enable the controller 160 to write data into the flash memory 180. In the prohibition mode, the controller 160 disable all of the write commands received from the host 120, but it is not limited thereto. In the prohibition mode, the controller 160 is further configured to disable (ignore) all of the read commands received from the host 120. In one embodiment, when the supply voltage VDD is outside (higher or lower than) the predetermined range, the controller 160 is further configured to produce a warning signal and transmit the warning signal to the host 120 for disabling the write and read operations of the flash memory 180, but it is not limited thereto. In another embodiment, the controller 160 produces the warning signal when the controller 160 receives the write command or read command in the prohibition mode. Furthermore, the controller 160 transmits the warning signal to the host 120 to disable the read commands and the write commands to read and write to the flash memory 180. For example, the controller 160 may enable the Write Protect Mode (Pull WP) to disable data being written into or read from the flash memory 180 when the supply voltage VDD is outside the predetermined range. Namely, the protection mechanism of the controller 160 may set the Write Protect Pin (Pull WP) to disable data to be wrote into or read from the flash memory 180 when the supply voltage VDD is outside the predetermined range. Moreover, the controller 160 may be further configured to ignore the read command received from the host device 120 when the supply voltage VDD is outside the predetermined range. Namely, the protection mechanism performed by the controller 160 may be further configured to ignore the read command received from the host device in the prohibition mode.

Moreover, in other embodiments, the predetermined range for the write voltage can be different from the predetermined range for the read voltage, such that the read commands and the write commands of the host device 120 can be prohibited, respectively. For example, in one embodiment, the prohibition mode may further include a read prohibition mode and write prohibition mode. The supply voltages VDD and the predetermined ranges of the read prohibition mode and write prohibition mode are different from each other. Namely, the read prohibition mode and write prohibition mode may be started in response to the different supply voltages VDD at different times. The read prohibition mode is arranged to disable the host 120 for retrieving data from the flash memory 180. The write prohibition mode is arranged to disable the host 120 for writing data into the flash memory 180.

More specifically, the controller 160 is configured to read the voltage detection device 190 at a predetermined time interval to obtain the value of the current supply voltage. The controller 160 is further configured to determine whether the current obtained supply voltage is outside the predetermined range, and operate in the prohibition mode when the current obtained supply voltage is outside the predetermined range. In the embodiment of the read prohibition mode and the write prohibition mode, the controller 160 is further configured to read the voltage detection device 190 at the predetermined time interval to obtain the value of the current supply voltage VDD, and determine whether the current obtained supply voltage VDD is outside the predetermined range corresponding to the read prohibition mode and/or the predetermined range corresponding to the write prohibition mode. The flash memory 180 operates in the read prohibition mode and/or the write prohibition mode when the supply voltage VDD is outside the predetermined range corresponding to the write prohibition mode and/or the predetermined range corresponding to the read prohibition mode, respectively. Moreover, in the prohibition mode, the controller 160 continues to read the voltage detection device 190 to obtain the value of the current supply voltage VDD, and determine whether the current supply voltage VDD is outside the predetermined range. When the current supply voltage VDD is not outside the predetermined range, the controller 160 exits the prohibition mode. In another embodiment, the voltage detection device 190 further includes a voltage comparator (not shown) arranged to compare the supply voltage VDD and the thresholds (the highest level and the lowest level) of the predetermined range by hardware circuit, and produce a determination signal when the supply voltage VDD is higher than the highest level of the predetermined range or lower than the lowest level of the predetermined range. The voltage comparator transmits the determination signal to the controller 160. When the controller 160 receives the determination signal representing that the supply voltage VDD is outside the predetermined range, the controller 160 operates in the prohibition mode. Conversely, when the controller 160 receives the determination signal representing that the supply voltage VDD is not outside the predetermined range, the controller 160 turns off the prohibition mode.

Figure 2:
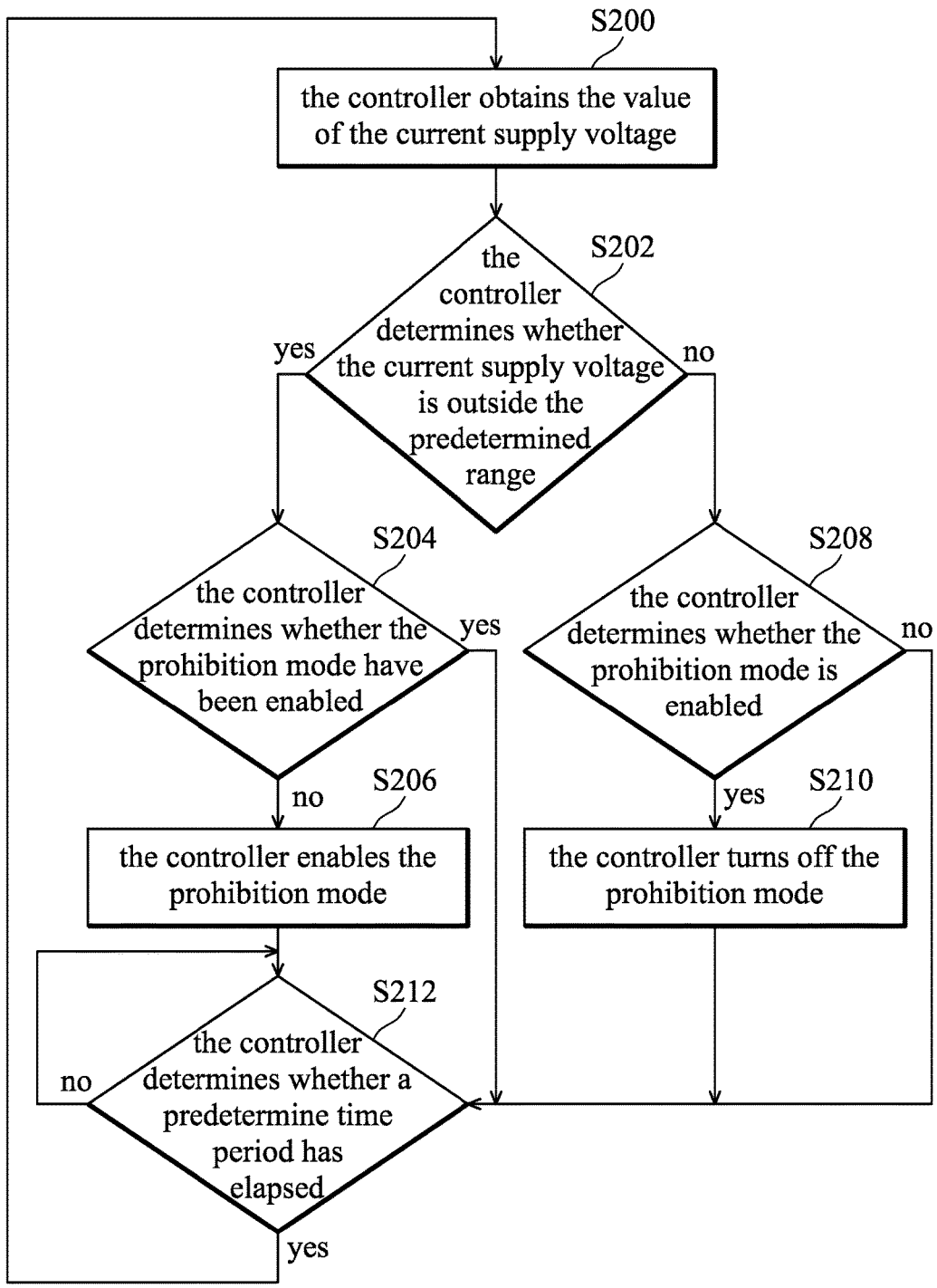
FIG. 2 is a flowchart of a voltage protection method according to an embodiment of the present invention.

FIG. 2 is a flowchart of a voltage protection method according to an embodiment of the present invention. The voltage protection method is applied to the data storage device 140 of FIG. 1. The process starts at step S200.

In step S200, the controller 160 reads the voltage detection device 190 to obtain the value of the current supply voltage VDD.

Next, in step S202, the controller 160 determines whether the current supply voltage VDD is outside the predetermined range. When the current supply voltage VDD is outside the predetermined range, the process goes to step S204. When the supply voltage VDD is not outside the predetermined range, the process goes to step S208. The skill in the art may determine the predetermined ranges according to the read and write error rates of the flash memory in different supply voltages VDD.

Next, in step S204, the controller 160 determines whether the prohibition mode has been turned on (enabled). When the prohibition mode is turned on, the process goes to step S208. When the prohibition mode is not turned on, the process goes to step S206.

Next, in step S206, the controller 160 enters the prohibition mode to disable all of the write commands received from the host 120. It should be noted that, in the prohibition mode, the controller 160 is further configured to disable all of the read commands of the host 120 when the supply voltage VDD is outside the predetermined range. In one embodiment, the controller 160 is further configured to produce a warning signal and transmit the warning signal to the host 120 for noticing the prohibition of reading and writing when the supply voltage VDD is outside the predetermined range, but it is not limited thereto. In another embodiment, when the controller 160 receives the write command or read command in the prohibition mode, the controller 160 transmits the warning signal to the host 120 to disable the read and write commands to read and write the flash memory 180. For example, the controller 160 may enable the Write Protect Mode (Pull WP) to disable data to be wrote into or read from the flash memory 180 when the supply voltage VDD is outside the predetermined range. Namely, the protection mechanism of the controller 160 may set the Write Protect Pin (Pull WP) to disable data from being written into or read from the flash memory 180 when the supply voltage VDD is outside the predetermined range. Moreover, the controller 160 may further configured to ignore the read command received from the host device 120 when the supply voltage VDD is outside the predetermined range. Namely, the protection mechanism performed by the controller 160 may further configured to ignore the read command received from the host device in the prohibition mode.

In step S208, the controller 160 determines whether the prohibition mode is turned on. When the prohibition mode is turned on, the process goes to step S210. When the prohibition mode is not turned on, the process goes to step S212.

In step S210, the controller 160 turns off the prohibition mode.

Next, in step S212, the controller 160 determines whether a predetermined time period has elapsed. When the predetermined time period has elapsed, the process goes to step S200, and the controller 160 continues to read the voltage detection device 190 for obtaining the value of the current supply voltage VDD. When the predetermined time period has not elapsed, the controller 160 continues to determine whether the predetermined time period has elapsed.

It will be seen from the above that the data storage device 140 and the voltage protection method may restrict the host device 120 to access the flash memory according the supply voltage VDD.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, arranged to store data;
a voltage detection device, arranged to detect a supply voltage received by the data storage device; and
a controller, configured to receive write commands from a host, and operate in
a prohibition mode when the supply voltage is outside a predetermined range, wherein the write command is arranged to enable the controller to write data into the flash memory, and the controller is configured to ignore all of the write commands received from the host while in the prohibition mode.

2. The data storage device as claimed in claim 1, wherein the controller is further configured to receive read commands from the host, and ignore all of the read commands received from the host in the prohibition mode, wherein the read command is arranged to enable the controller to retrieve data from the flash memory.

3. The data storage device as claimed in claim 1, wherein the controller is further configured to produce a warning signal for noticing the prohibition of reading and writing when the supply voltage is outside the predetermined range.

4. The data storage device as claimed in claim 1, wherein the controller is further configured to read the voltage detection device at a predetermined time interval to obtain a value of the current supply voltage.

5. The data storage device as claimed in claim 4, wherein the controller is further configured to enable the prohibition mode when the current supply voltage is outside the predetermined range, and disable the prohibition mode when the current supply voltage is in the predetermined range.

6. A voltage protection method, applied to a data storage device of a flash memory, comprising:
determining whether a supply voltage received by the data storage device is outside a predetermined range; and
performing a prohibition mode when the supply voltage is outside a predetermined range for ignoring write commands received from a host to write data into the flash memory.

7. The voltage protection method as claimed in claim 6, further comprising:
ignoring read commands received from the host to retrieve data from the flash memory in the prohibition mode.

8. The voltage protection method as claimed in claim 6, further comprising:
reading a voltage detection device at a predetermined time interval to obtain value of current supply voltage.

9. The voltage protection method as claimed in claim 6, further comprising:
   producing a warning signal when the supply voltage is outside the predetermined range; and
   transmitting the warning signal to the host for noticing the prohibition of reading and writing.

10. The voltage protection method as claimed in claim 6, further comprising:
    disabling the prohibition mode when the supply voltage is within the predetermined range.

11. The voltage protection method as claimed in claim 6, wherein the flash memory comprises a plurality of parameters corresponding to a plurality of pre-stored predetermined ranges, and the voltage protection method further comprises:
    selecting one of the pre-stored predetermined ranges according to a first key or a first identifier;
    using the selected pre-stored predetermined range as the predetermined range, wherein different vendors and clients have different keys or different identifiers.

12. The voltage protection method as claimed in claim 6, wherein the step of the disabling write commands received from the host to write data into the flash memory further comprise setting a Write Protect Pin of a controller to ignore data to be wrote into or read from the flash memory.

\* \* \* \* \*